US012733441B2

(12) United States Patent
Shinoda et al.

(10) Patent No.: US 12,733,441 B2
(45) Date of Patent: Sep. 8, 2026

(54) SUBSTRATE TRANSFER METHOD

(71) Applicant: Tokyo Electron Limited, Tokyo (JP)

(72) Inventors: Nanako Shinoda, Yamanashi (JP); Shinya Okano, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 260 days.

(21) Appl. No.: 18/550,011

(22) PCT Filed: Mar. 17, 2022

(86) PCT No.: PCT/JP2022/012404
§ 371 (c)(1),
(2) Date: Sep. 11, 2023

(87) PCT Pub. No.: WO2022/202626
PCT Pub. Date: Sep. 29, 2022

(65) Prior Publication Data

US 2024/0153807 A1 May 9, 2024

(30) Foreign Application Priority Data

Mar. 24, 2021 (JP) ................................ 2021-050068

(51) Int. Cl.
*H10P 72/50* (2026.01)
*H10P 72/30* (2026.01)
*H10P 72/76* (2026.01)

(52) U.S. Cl.
CPC .......... *H10P 72/50* (2026.01); *H10P 72/3306* (2026.01); *H10P 72/7602* (2026.01)

(58) Field of Classification Search
CPC ............... H01L 21/68; H01L 21/67748; H01L 21/68707; H01L 21/677; H01L 21/67745; H01L 21/67742; H01L 21/67754; H01L 21/681; B65G 49/07
See application file for complete search history.

(56) References Cited

U.S. PATENT DOCUMENTS 4,770,590 A * 9/1988 Hugues ................. H01L 21/681 901/17
5,740,059 A * 4/1998 Hirata .............. H01L 21/67778 414/217
5,975,834 A * 11/1999 Ogawa ..................... B25J 18/04 414/744.5

(Continued)

*Primary Examiner* — Wade Miles
*Assistant Examiner* — James Brian Chin
(74) *Attorney, Agent, or Firm* — IPUSA, PLLC

(57) ABSTRACT

A substrate transfer method includes receiving first and second substrates by a pick of a first transfer device, detecting shift amounts of the first and second substrates, calculating a correction amount of a delivery position of the pick based on the shift amount of the first substrate, and moving the pick to the corrected delivery position to respectively deliver the first and second substrates to a first and second mounting sections, moving a first pick of a second transfer device to a receiving position of the first mounting section to receive the first substrate, calculating a correction amount of a receiving position of a second pick of the second transfer device based on the correction amount of the delivery position and the shift amount of the second substrate; and moving the second pick to the corrected receiving position of the second pick to receive the second substrate.

7 Claims, 12 Drawing Sheets

(56) References Cited

U.S. PATENT DOCUMENTS

| | | | | |
|---|---|---|---|---|
| 6,022,185 | A * | 2/2000 | Mokuo | H01L 21/67742 414/744.6 |
| 8,060,252 | B2 * | 11/2011 | Gage | H01L 21/67742 901/6 |
| 12,362,215 | B2 * | 7/2025 | Shindo | H01L 21/68707 |
| 2008/0199283 | A1 * | 8/2008 | Mitsuyoshi | H01L 21/67201 414/222.01 |
| 2009/0142163 | A1 * | 6/2009 | Genetti | H01L 21/67742 414/217 |
| 2009/0143911 | A1 * | 6/2009 | Gage | H01L 21/67196 901/14 |
| 2011/0153062 | A1 * | 6/2011 | Hong | H01L 21/67766 700/218 |
| 2017/0372933 | A1 * | 12/2017 | Kim | H01L 21/67748 |
| 2023/0170239 | A1 * | 6/2023 | Shindo | H01L 21/67742 414/749.1 |

* cited by examiner

SUBSTRATE TRANSFER METHOD

TECHNICAL FIELD

The present disclosure relates to a substrate transfer method.

BACKGROUND

A substrate processing system, in which a substrate is transferred from a processing chamber to a load lock chamber via a vacuum transfer chamber by a transfer device provided in the vacuum transfer chamber and the substrate is transferred from the load lock chamber to a carrier attached to a load port by a transfer device provided in an atmospheric transfer chamber, is known, for example.

Patent Document 1 discloses a system configured to measure, when a wafer is transferred from a first position to an intermediate position by an end effector of a first robot, a relative position between the wafer and the end effector, adjust a position at which an end effector of a second robot picks up the wafer from the intermediate position based on the measurement result, and transfer the wafer from the intermediate position to a second position by the end effector of the second robot.

CITATION LIST

Patent Document

[Patent Document 1] U.S. Pat. No. 8,060,252

SUMMARY

Problem to be Solved by the Invention

There is a possibility that the position of the substrate is shifted during the substrate processing in the processing chamber. Therefore, there is a demand for a transfer method of correcting the position of the shifted substrate and transferring the substrate to the carrier.

One aspect of the present disclosure provides a substrate transfer method of correcting a positional shift of a substrate and transferring the substrate.

Means for Solving Problem

A substrate transfer method according to an aspect of the present disclosure includes a step of receiving a first substrate and a second substrate by a pick of a first transfer device, a step of detecting a shift amount of the first substrate and a shift amount of the second substrate that are held by the pick, a step of calculating a correction amount of a delivery position of the pick based on the shift amount of the first substrate, a step of moving the pick of the first transfer device to the corrected delivery position of the pick to deliver the first substrate to a first mounting section of a second chamber and deliver the second substrate to a second mounting section of the second chamber, a step of moving a first pick of a second transfer device to a receiving position of the first mounting section to receive the first substrate by the first pick, a step of calculating a correction amount of a receiving position of a second pick of the second transfer device based on the correction amount of the delivery position of the pick and the shift amount of the second substrate, and a step of moving the second pick of the second transfer device to the corrected receiving position of the second pick to receive the second substrate by the second pick.

Effect of Invention

According to an aspect of the present disclosure, a substrate transfer method of correcting a positional shift of a substrate and transferring the substrate is provided.

DESCRIPTION OF EMBODIMENTS

Figure 1:
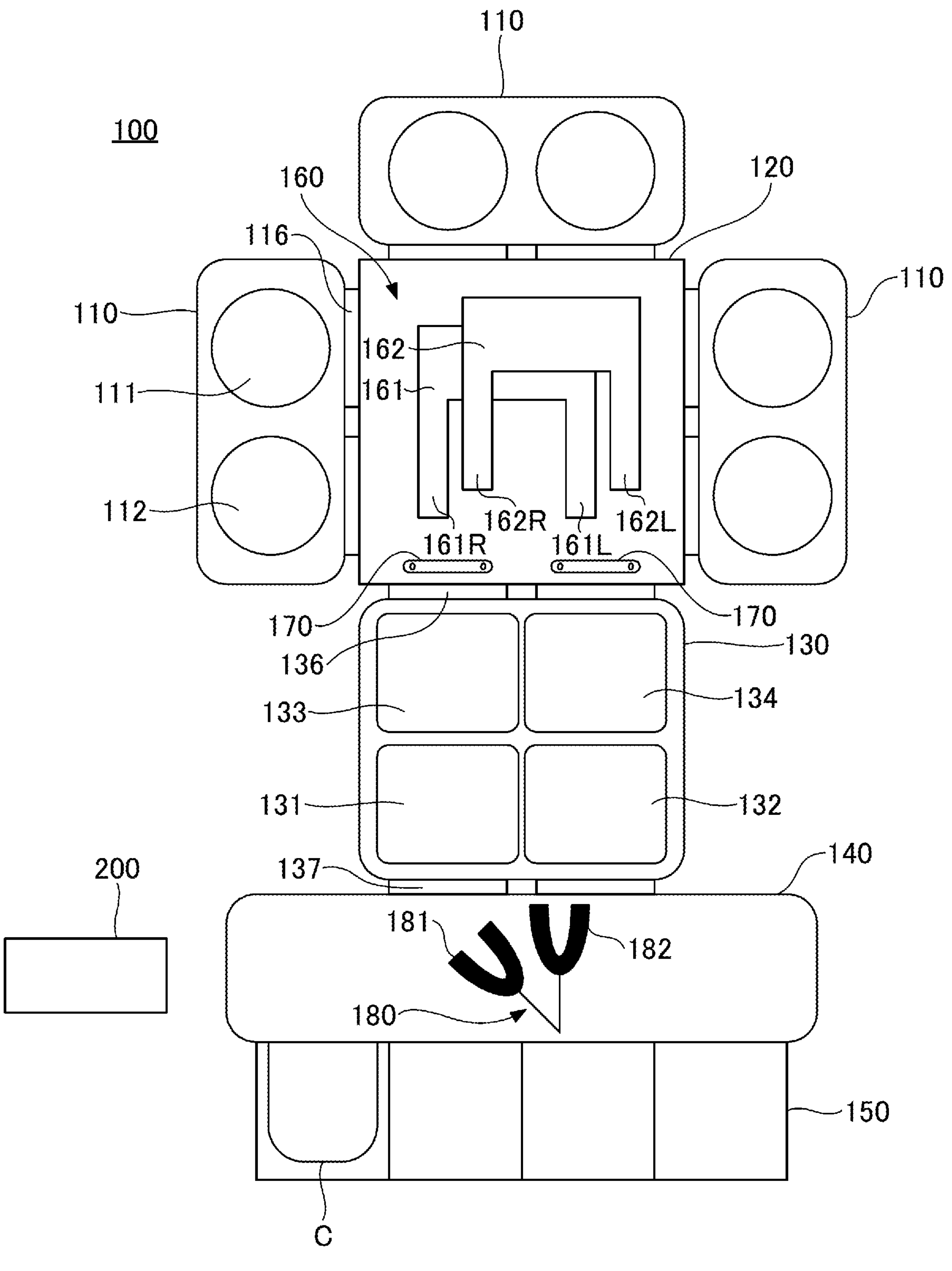
FIG. 1 is a plan view illustrating a configuration of an example of a substrate processing system according to an embodiment.

In the following, embodiments of the present disclosure will be described with reference to the drawings. In the drawings, the same components are denoted by the same reference symbols, and duplicated description may be omitted.

<Substrate Processing System 100>

An example of an overall configuration of a substrate processing system 100 according to an embodiment will be described with reference to FIG. 1. FIG. 1 is a plan view illustrating an example configuration of the substrate processing system 100 according to the embodiment.

The substrate processing system 100 illustrated in FIG. 1 is a cluster structure (multi-chamber type) system. The substrate processing system 100 includes multiple processing chambers 110, a vacuum transfer chamber 120, a load lock chamber 130, an atmospheric transfer chamber 140, a load port 150, and a controller 200.

The processing chamber 110 is depressurized to a predetermined vacuum atmosphere, and a desired process (an etching process, a film deposition process, a cleaning process, an ashing process, and the like) is performed on a wafer (substrate) W in the processing chamber 110. The processing chamber 110 is disposed adjacent to the vacuum transfer chamber 120. The processing chamber 110 and the vacuum transfer chamber 120 communicate with each other by opening and closing a gate valve 116. The processing chamber 110 includes two mounting sections 111 and 112 on which the wafers W are mounted. Here, an operation of each section for processing in the processing chamber 110 is controlled by the controller 200.

The vacuum transfer chamber 120 is connected to multiple chambers (the processing chamber 110 and the load lock chamber 130) via gate valves 116 and 136 and is depressurized to a predetermined vacuum atmosphere. Additionally, a vacuum transfer device 160 configured to transfer the wafer W is provided inside the vacuum transfer chamber 120. The vacuum transfer device 160 includes picks 161 and 162 that hold the wafers W. The pick 161 has substrate holders 161R and 161L that hold the wafers W and is configured to transfer two wafers W at the same time. Similarly, the pick 162 has substrate holders 162R and 162L that hold the wafers W and is configured to transfer two wafers W at the same time. The vacuum transfer device 160 performs carry-in and carry-out of the wafer W between the processing chamber 110 and the vacuum transfer chamber 120 according to the opening and closing of the gate valve 116. Additionally, the vacuum transfer device 160 performs carry-in and carry-out of the wafer W between the load lock chamber 130 and the vacuum transfer chamber 120 according to the opening and closing of the gate valve 136. Here, the operation of the vacuum transfer device 160 and the opening and closing of the gate valves 116 and 136 are controlled by the controller 200.

Figure 2:
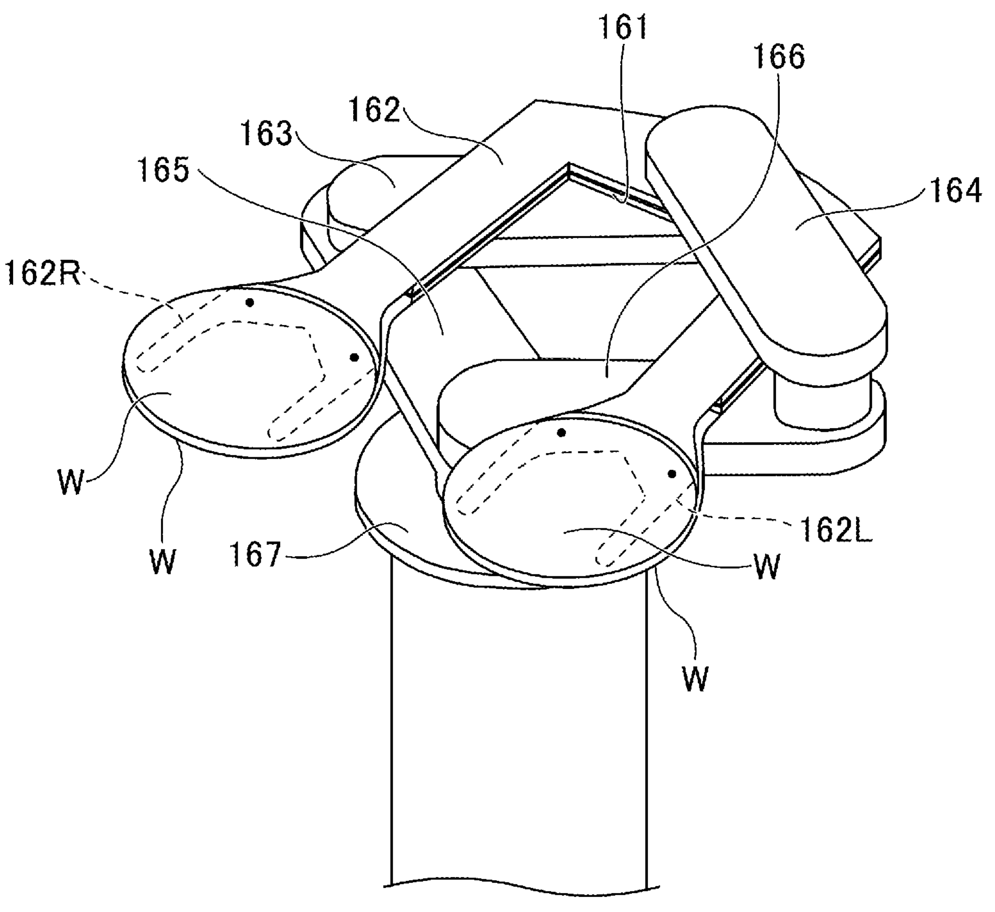
FIG. 2 is a perspective view illustrating an example of the substrate transfer device.

Here, an example of the vacuum transfer device 160 will be described with reference to FIG. 2. FIG. 2 is a perspective view illustrating an example of the vacuum transfer device 160. The vacuum transfer device 160 includes the picks 161 and 162, arms 163 to 166, and a base 167. Here, FIG. 2 illustrates a state in which the picks 161 and 162 are disposed to overlap with each other in two stages, upper and lower, and the wafers W are respectively held by the substrate holders 161R and 161L (see FIG. 1) of the pick 161 and the substrate holders 162R and 162L of the pick 162.

The pick 161, the arm 163, and the arm 165 form a first arm. One end of the arm 165 is rotatably connected to the base 167. The other end of the arm 165 and one end of the arm 163 are rotatably connected to each other. The other end of the arm 163 and a base of the pick 161 are rotatably connected to each other. The pick 161 is bifurcated from the base of the pick 161. The substrate holder 161R (see FIG. 1) is provided on one portion of the bifurcated portions, and the substrate holder 161L (see FIG. 1) is provided on the other portion of the bifurcated portions. The controller 200 can control the angle of each joint of the first arm to extend and retract the first arm and control the position and the orientation of the pick 161.

Similarly, the pick 162, the arm 164 and the arm 166 form a second arm. One end of the arm 166 is rotatably connected to the base 167. The other end of the arm 166 and one end of the arm 164 are rotatably connected to each other. The other end of the arm 164 and a base of the pick 162 are rotatably connected to each other. The pick 162 is bifurcated from the base of the pick 162. The substrate holder 162R is provided on one portion of the bifurcated portions, and the substrate holder 162L is provided on the other portion of the bifurcated portions. The controller 200 can control the angle of each joint of the second arm to extend and retract the second arm and control the position and the orientation of the pick 162.

The base 167 is provided on a floor surface of the vacuum transfer chamber 120. Additionally, the base 167 includes a raising/lowering mechanism (not illustrated) that raises and lowers the first arm and the second arm. The controller 200 can raise and lower the first arm and the second arm by controlling the raising/lowering mechanism.

Returning back to FIG. 1, the vacuum transfer chamber 120 includes a sensor 170 configured to detect positions of the wafers W held by the picks 161 and 162. The sensor 170 includes, for example, two light-shielding sensors for one transfer path of the wafer W and is provided on the front side of the gate valve 136. When the wafer W held by the substrate holders 161R and 161L of the pick 161 is transferred from the vacuum transfer chamber 120 to the load lock chamber 130, the wafer W held by the pick 161 passes through the sensor 170. At this time, the sensor 170 detects the edge of the wafer W. This can detect the position of the wafer W on the pick 161 (the relative position of the wafer W with respect to the pick 161). In other words, the shift amounts of the positions of the wafers W actually held by the respective substrate holders 161R and 161L with respect to the reference holding positions in the substrate holders 161R and 161L can be detected. Similarly, when the wafers W are transferred by the pick 162, the shift amounts of the wafers W can be detected.

The load lock chamber 130 is provided between the vacuum transfer chamber 120 and the atmospheric transfer chamber 140. The load lock chamber 130 includes mounting sections 131 to 134 on which the wafers W are mounted. The load lock chamber 130 is configured to switch between an air atmosphere and a vacuum atmosphere. The load lock chamber 130 and the vacuum transfer chamber 120 in the vacuum atmosphere communicate with each other by opening and closing a gate valve 136. The load lock chamber 130 and the atmospheric transfer chamber 140 in the air atmosphere communicate with each other by opening and closing a door valve 137. Here, switching between the vacuum atmosphere and the air atmosphere in the load lock chamber 130 is controlled by the controller 200.

Figure 3:
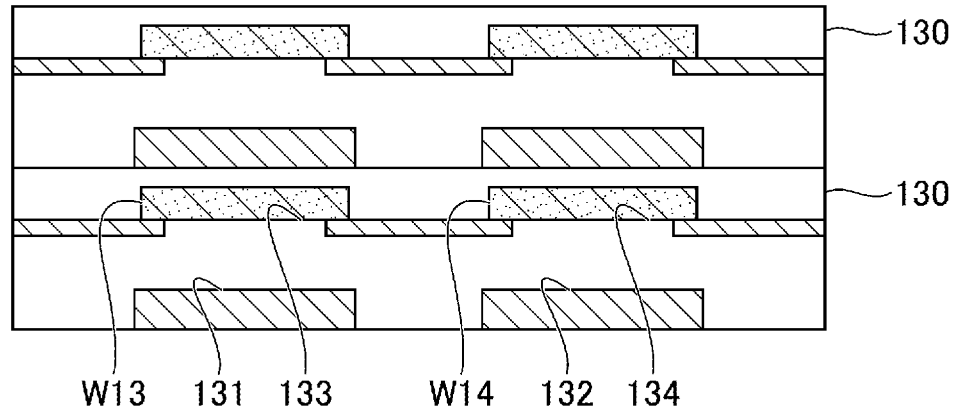
FIG. 3 is a schematic side sectional view illustrating an example of a load lock chamber.

Here, an example of the load lock chamber 130 will be described with reference to FIG. 3. FIG. 3 is a schematic side cross-sectional view illustrating an example of the load lock chamber 130. Here, FIG. 3 is a view when the load lock chamber 130 is viewed from the atmospheric transfer chamber 140 side. Two chambers may be vertically provided in the load lock chambers 130. Additionally, one load lock chamber 130 includes the mounting sections 131 and 132 provided at a lower stage and the mounting sections 133 and 134 provided at an upper stage. Here, the mounting sections 131 and 132 and the mounting sections 133 and 134 are vertically arranged, but in FIG. 1 (and FIGS. 5 to 8 to be described later), the mounting sections 131 and 132 at the lower stage and the mounting sections 133 and 134 at the upper stage are schematically illustrated to be shifted in the up-and-down direction. Here, in FIG. 3, wafers W13 and W14 are illustrated as being mounted on the mounting sections 133 and 134.

The mounting section 131 has a lifter pin 131*p* (see 9A to be described later) that moves up and down from a mounting surface of the mounting section 131. Additionally, the mounting section 132 includes a lifter pin 132*p* (see FIG. 9A to be described later) that moves up and down from a mounting surface of the mounting section 132. For example, when the wafers W are delivered between the pick 161 and the mounting sections 131 and 132 at the lower stage, the pick 161 holding the wafers W in the substrate holders 161R and 161L transfers the wafers W to above the mounting sections 131 and 132. Then, as the lifter pins 131*p* and 132*p* move up, the lifter pins 131*p* and 132*p* lift the wafers W and receive the wafers W. Then, after the pick 161 is retracted from the load lock chamber 130, the lifter pins 131*p* and 132*p* move down to mount the wafers W on the mounting surfaces of the mounting sections 131 and 132. This allows the wafer W held by the substrate holder 161R of the pick 161 to be delivered to the mounting section 131, and the wafer W held by the substrate holder 161L of the pick 161 to be delivered to the mounting section 132. The same applies to the case where the wafer W is delivered between the pick 162 and the mounting sections 131 and 132.

The mounting section 133 is configured by a support plate having an opening. Additionally, the mounting section 134 is configured by a support plate having an opening. For example, when the wafer W is delivered between the pick 161 and the mounting sections 133 and 134 at the upper stage, the pick 161 holding the wafers W in the respective substrate holders 161R and 161L transfers the wafers W to above the support plate. Then, the pick 161 is lowered by the raising/lowering mechanism of the vacuum transfer device 160, and the substrate holders 161R and 161L pass through the openings of the support plate, so that the outer edge portions of the lower surfaces of the wafers W are supported by the support plate and the wafers W are mounted on the mounting sections 133 and 134. This allows the wafer W held by the substrate holder 161R of the pick 161 to be delivered to the mounting section 133, and the wafer W held by the substrate holder 161L of the pick 161 to be delivered to the mounting section 134. The same applies to the case where the wafers W are transferred between the pick 162 and the mounting sections 133 and 134.

Returning back to FIG. 1, the atmospheric transfer chamber 140 is in the air atmosphere, and a downflow of clean air is formed, for example. Additionally, an atmospheric transfer device 180 configured to transfer the wafer W is provided inside the atmospheric transfer chamber 140. The atmospheric transfer device 180 performs carry-in and carry-out of the wafer W between the load lock chamber 130 and the atmospheric transfer chamber 140 according to opening and closing of the door valve 137. Here, the operation of the atmospheric transfer device 180 and the opening and closing of the door valve 137 are controlled by the controller 200.

Additionally, a load port 150 is provided on a wall surface of the atmospheric transfer chamber 140. A carrier C in which the wafers W are accommodated or an empty carrier C is attached to the load port 150. As the carrier C, for example, a front opening unified pod (FOUP) or the like can be used.

The atmospheric transfer device 180 may take out the wafers W accommodated in the carrier C attached to the load port 150 and mount the wafers W on the mounting sections 131 to 134 of the load lock chamber 130. Additionally, the atmospheric transfer device 180 may take out the wafers W mounted on the mounting sections 131 to 134 of the load lock chamber 130 and accommodate the wafers W in the carrier C attached to the load port 150.

The atmospheric transfer device 180 includes a first arm including a first pick 181 configured to hold the wafer W, a second arm including a second pick 182 configured to hold the wafer W, a base (not illustrated), and a sliding mechanism (not illustrated). Additionally, the first pick 181 and the second pick 182 are disposed at different heights, and are configured such that the first pick 181 holding the wafer W and the second pick 182 holding the wafer W are disposed to overlap each other in two stages, upper and lower.

The first arm is, for example, a scalar type arm, one end is rotatably connected to the base, and the first arm includes the first pick 181 on the other end. By controlling the angle of each joint of the first arm, the controller 200 can extend and retract the first arm and control the position and orientation of the first pick 181. Similarly, the second arm is, for example, a scalar type arm, one end is rotatably connected to the base, and the second arm includes the second pick 182 on the other end. By controlling the angle of each joint of the second arm, the controller 200 can extend and retract the second arm and control the position and orientation of the second pick 182.

The base includes a raising/lowering mechanism (not illustrated) that raises and lowers the first arm and the second arm. The controller 200 can raise and lower the first arm and the second arm by controlling the raising/lowering mechanism.

The sliding mechanism is configured to move the base in parallel along the arrangement of the load ports 150. The controller 200 can move the first arm, the second arm, and the base in the sliding direction by controlling the sliding mechanism.

The controller 200 includes a central processing unit (CPU), a read only memory (ROM), a random access memory (RAM), and a hard disk drive (HDD). The storage area is not limited to the HDD, and the controller 200 may include another storage area such as a solid state drive (SSD). A recipe in which a process procedure, a process condition, and a transfer condition are set is stored in the storage area such as the HDD and the RAM.

The CPU controls the processing of the wafer W in each processing chamber 110 according to the recipe and controls the transfer of the wafer W. The HDD or the RAM may store a program for performing the processing of the wafer W in each processing chamber 110 and the transfer of the wafer W. The program may be provided by being stored in a storage medium, or may be provided from an external device through a network.

Figure 4:
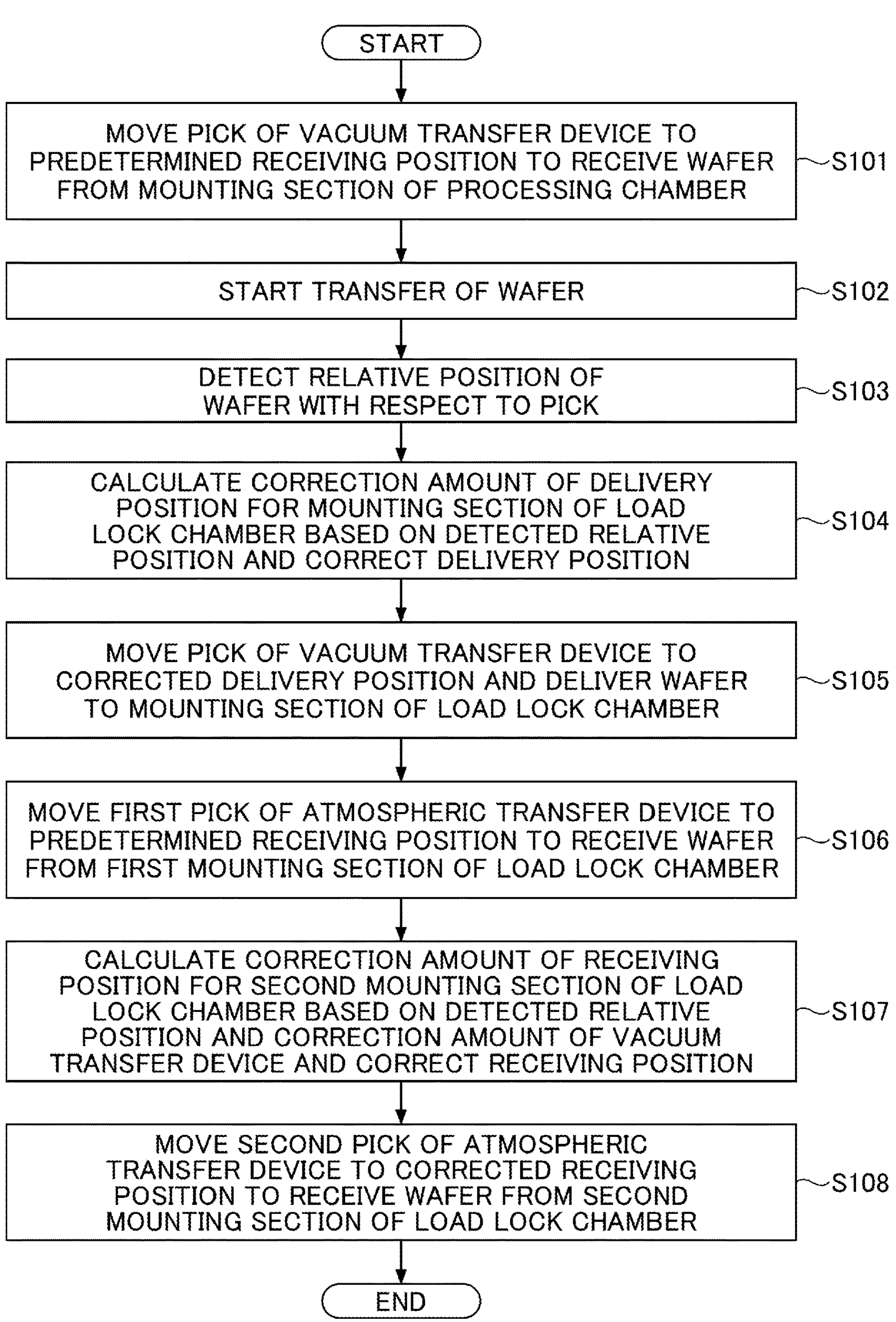
FIG. 4 is an example of a flowchart of a wafer transfer operation.

Next, an example of an operation of transferring the wafers W mounted on the mounting sections 111 and 112 of the processing chamber 110 will be described with reference to FIG. 4. FIG. 4 is an example of a flowchart of the transfer operation of the wafer W. Here, for two wafers W processed in the processing chamber 110, an operation of transferring the two wafers W mounted on the mounting sections 111 and 112 of the processing chamber 110 to the mounting sections 131 and 132 in the load lock chamber 130 by the pick 161 of the vacuum transfer device 160 and accommodating the two wafers W in the carrier C of the load port 150 by the first pick 181 and the second pick 182 of the atmospheric transfer device 180 will be described as an example. Here, when the wafers W are processed in the processing chamber 110, positional shifts of the wafers W in the mounting sections 111 and 112 may occur.

In step S101, the pick 161 of the vacuum transfer device 160 is moved to a predetermined receiving position to receive two wafers W from the mounting sections 111 and 112 of the processing chamber 110. Here, the substrate holder 161R receives the wafer W11 (see FIG. 5) from the mounting section 111, and the substrate holder 161L receives the wafer W12 (see FIG. 5) from the mounting section 112.

In step S102, the transfer of the wafers W11 and W12 is started. Here, by moving the pick 161 holding the wafers W11 and W12 from the processing chamber 110 to the load lock chamber 130 via the vacuum transfer chamber 120, the wafers W11 and W12 are transferred at the same time.

In step S103, the relative positions of the wafers W11 and W12 with respect to the pick 161 is detected. During the transfer of the wafers W11 and W12, the wafers W11 and W12 pass through the sensor 170. The sensor 170 detects the edges of the wafers W11 and W12. With this, based on the detection of the edges by the sensor 170 and the positional information of the pick 161 controlled by the vacuum transfer device 160, the controller 200 detects the relative positions of the wafers W11 and W12 with respect to the pick 161, in other words, the shift amount between the reference holding position of the substrate holder 161R and the wafer W11 that is actually held, and the shift amount between the reference holding position of the substrate holder 161L and the wafer W 12 that is actually held.

Figure 5:
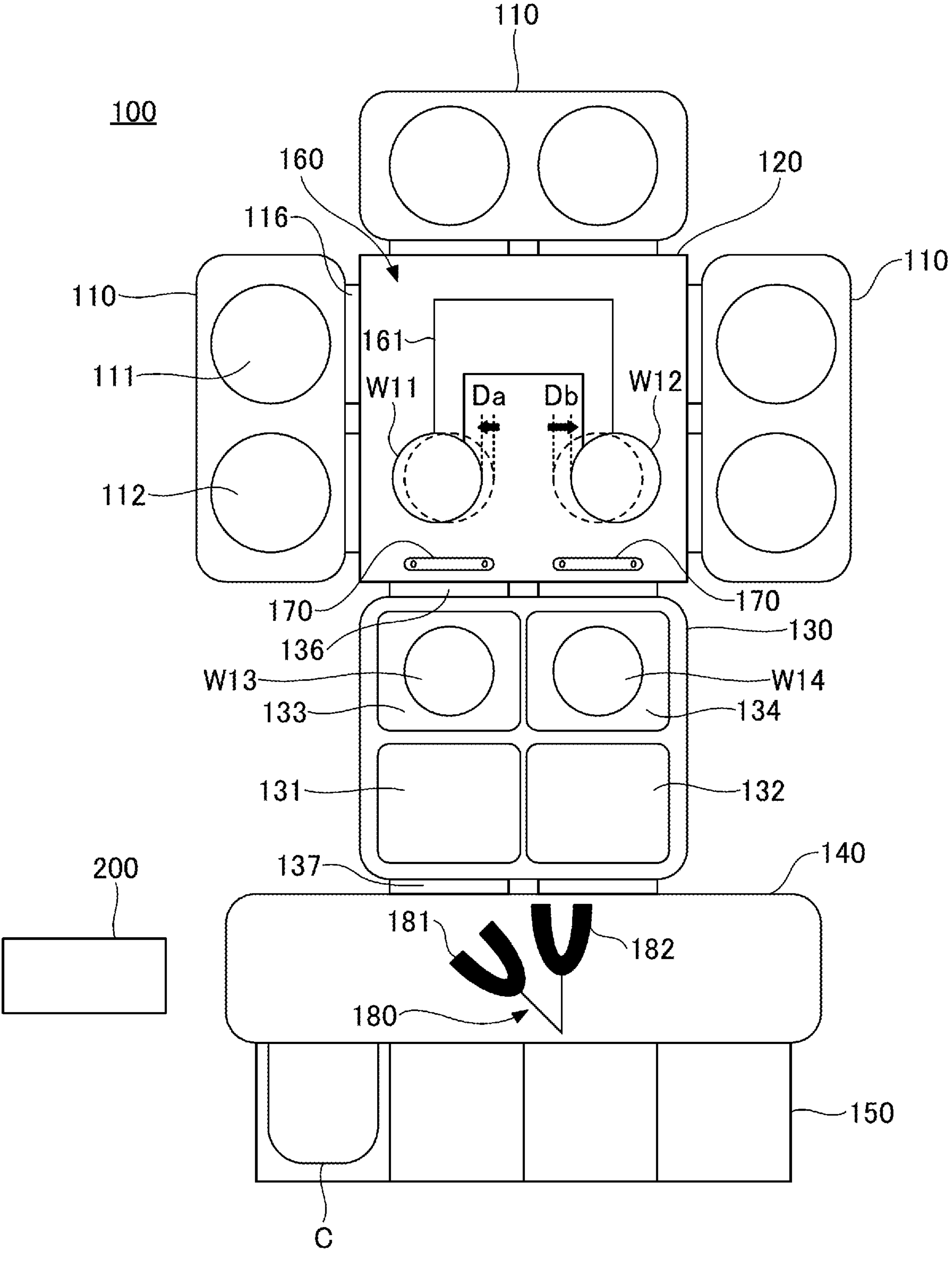
FIG. 5 is a schematic view illustrating an example of shift amounts of wafers held by a pick of a vacuum transfer device.

FIG. 5 is a schematic diagram illustrating an example of shift amounts of the wafers W11 and W12 held by the pick 161 of the vacuum transfer device 160. Here, the wafer W11 is held by the substrate holder 161R, and the wafer W12 is held by the substrate holder 161L. Additionally, in FIG. 5, the reference holding positions of the substrate holders 161R and 161L are indicated by the broken lines. Here, the following description assumes that the wafer W11 held by the substrate holder 161R is shifted by a shift amount Da in a direction indicated by the arrow (the left direction on the paper) and the wafer W12 held by the substrate holder 161L is shifted by a shift amount Db in a direction indicated by the arrow (the right direction on the paper).

In step S104, based on the detected relative positions (the shift amounts) of the wafers W with respect to the pick 161, a correction amount of the delivery position for the mounting sections 131 and 132 of the load lock chamber 130 is calculated and the delivery position is corrected. Specifically, based on the shift amount Da of the wafer W11 held by the substrate holder 161R, the correction amount of the delivery position of the pick 161 is calculated and the delivery position is corrected. Here, the controller 200 calculates the correction amount of the delivery position of the pick 161 so that a shift amount of the wafer W11 that is actually mounted with respect to the reference mounting position of the mounting section 131 is less than or equal to a set amount Dx when the wafer W11 is delivered to the mounting section 131. In the example illustrated in FIG. 5, the correction amount of the delivery position of the pick 161 is (Da−Dx).

Here, the set amount Dx is set based on, for example, a design and operation of the substrate processing system 100.

In step S105, the pick 161 of the vacuum transfer device 160 is moved to the corrected delivery position, and the wafers W11 and W12 are delivered from the substrate holders 161R and 161L to the mounting sections 131 and 132 of the load lock chamber 130.

Figure 6:
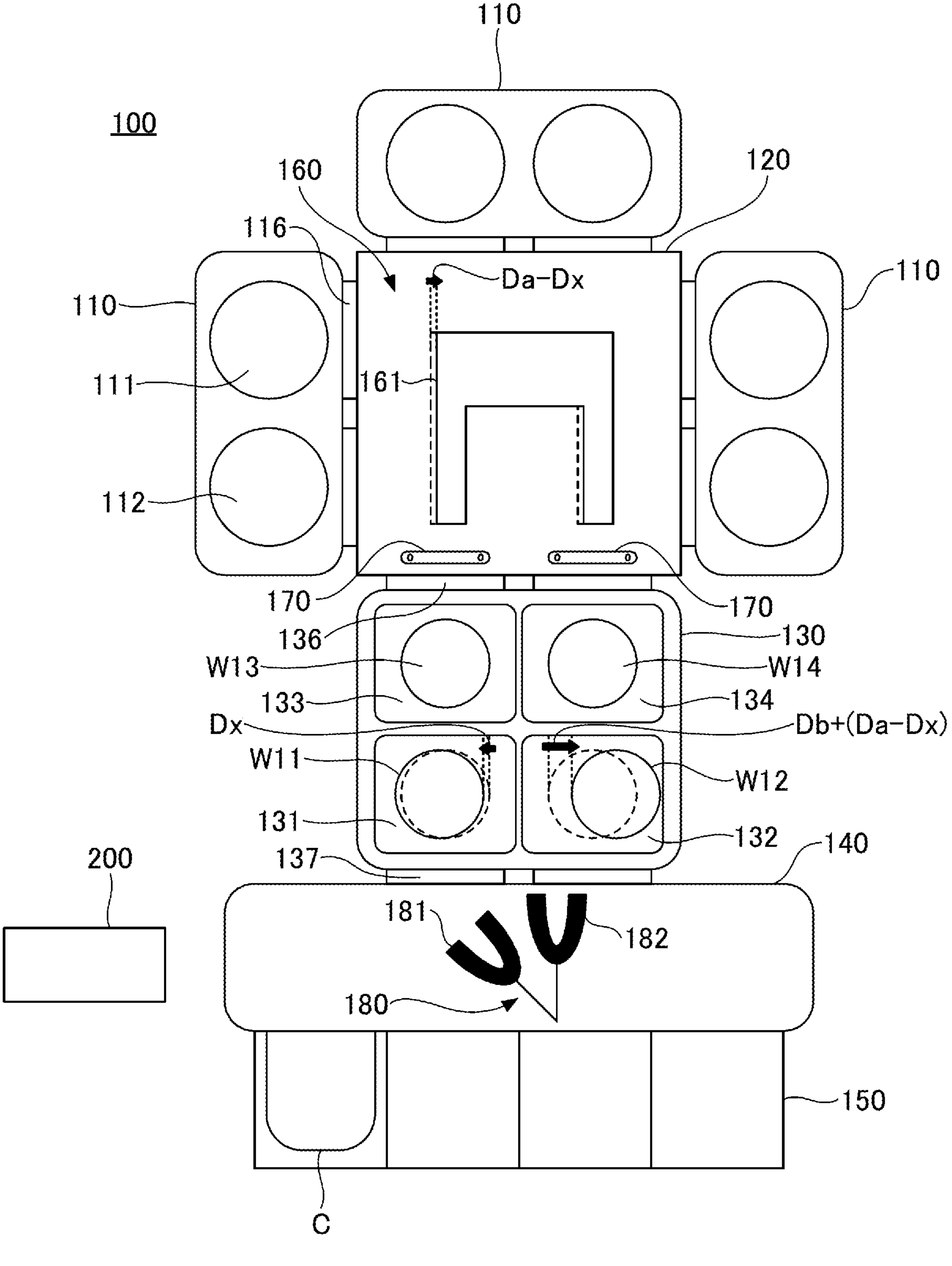
FIG. 6 is a schematic view illustrating an example of a state after wafers are mounted on mounting sections.

FIG. 6 is a schematic diagram illustrating an example of a state after the wafers W11 and W12 are mounted on the mounting sections 131 and 132. As illustrated in FIG. 6, the pick 161 delivers the wafer W11 from the substrate holder 161R to the mounting section 131 and delivers the wafer W12 from the substrate holder 161L to the mounting section 132 at the delivery position corrected by the correction amount (Da−Dx) in the direction indicated by the arrow (the right direction on the paper). Additionally, in FIG. 6, the reference mounting positions of the mounting sections 131 and 132 are indicated by the broken lines. The wafer W11 mounted on the mounting section 131 is shifted by the set amount Dx in the direction indicated by the arrow (the left direction on the paper), and the wafer W12 mounted on the mounting section 132 is shifted by a shift amount Db+(Da−Dx) in the direction indicated by the arrow (the right direction on the paper).

Subsequently, when the pick 161 is retracted from the load lock chamber 130, the controller 200 closes the gate valve 136. Additionally, the inside of the load lock chamber 130 is switched from the vacuum atmosphere to the air atmosphere.

In step S106, the first pick 181 of the atmospheric transfer device 180 is moved to the predetermined receiving position to receive the wafer W from the mounting section 131 of the load lock chamber 130.

Figure 7:
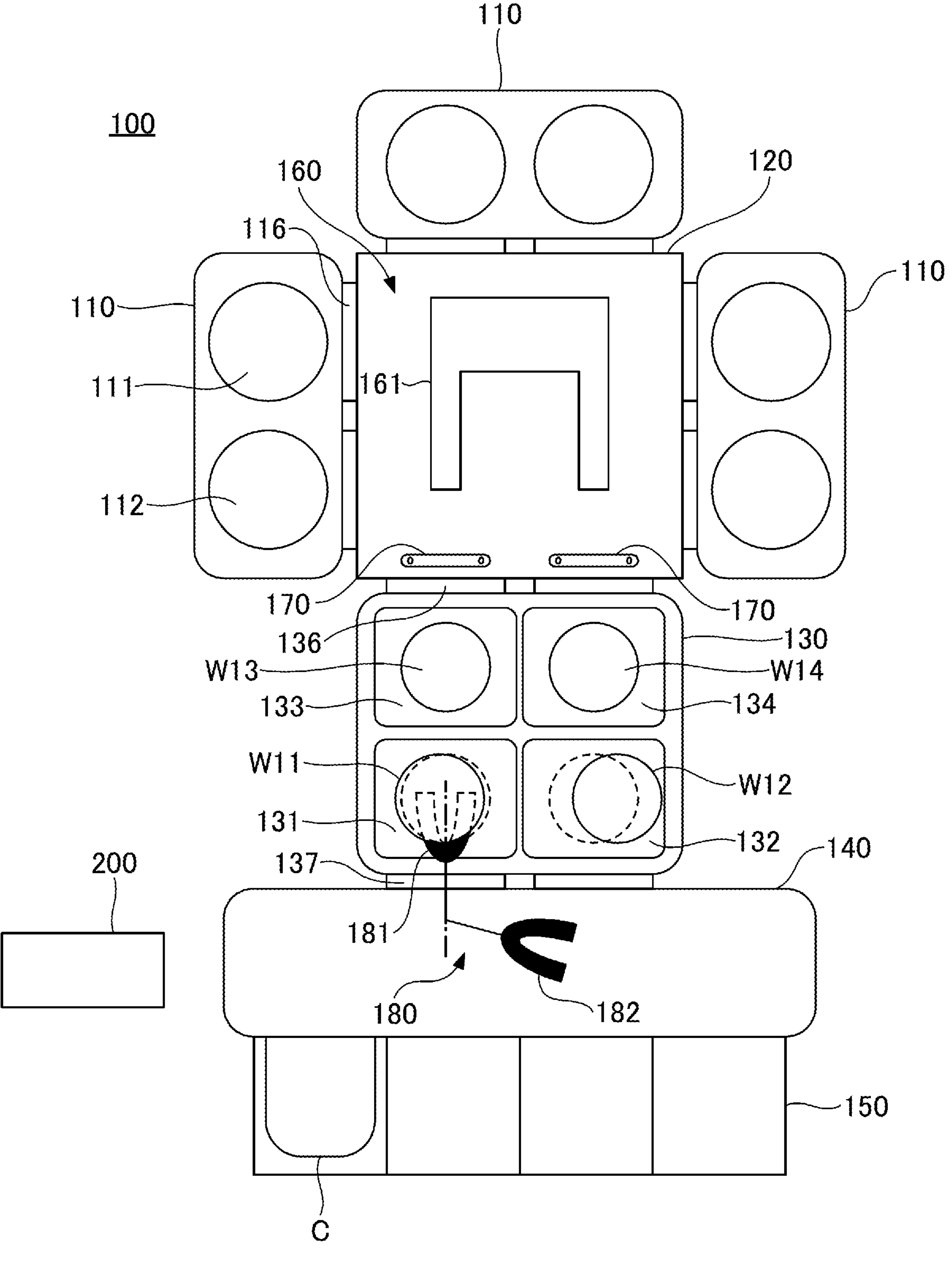
FIG. 7 is a schematic view illustrating an example of a case in which a wafer is received by a first pick of the atmospheric transfer apparatus.

FIG. 7 is a schematic diagram illustrating an example when the wafer W11 is received by the first pick 181 of the atmospheric transfer device 180. Here, without correcting the receiving position of the first pick 181, the first pick 181 is moved to the predetermined receiving position to receive the wafer W11 from the mounting section 131 of the load lock chamber 130.

In step S107, based on the detected relative position and the correction amount of the pick 161 of the vacuum transfer device 160, the correction amount of the receiving position of the load lock chamber 130 with respect to the mounting section 132 is calculated and the receiving position is corrected. Specifically, based on the shift amount Db of the wafer W12 held by the substrate holder 161L and the correction amount (Da−Dx) of the delivery position of the pick 161, the correction amount of the receiving position of the second pick 182 is calculated and the receiving position is corrected.

In step S108, the second pick 182 of the atmospheric transfer device 180 is moved to the corrected receiving position to receive the wafer W from the mounting section 132 of the load lock chamber 130.

Figure 8:
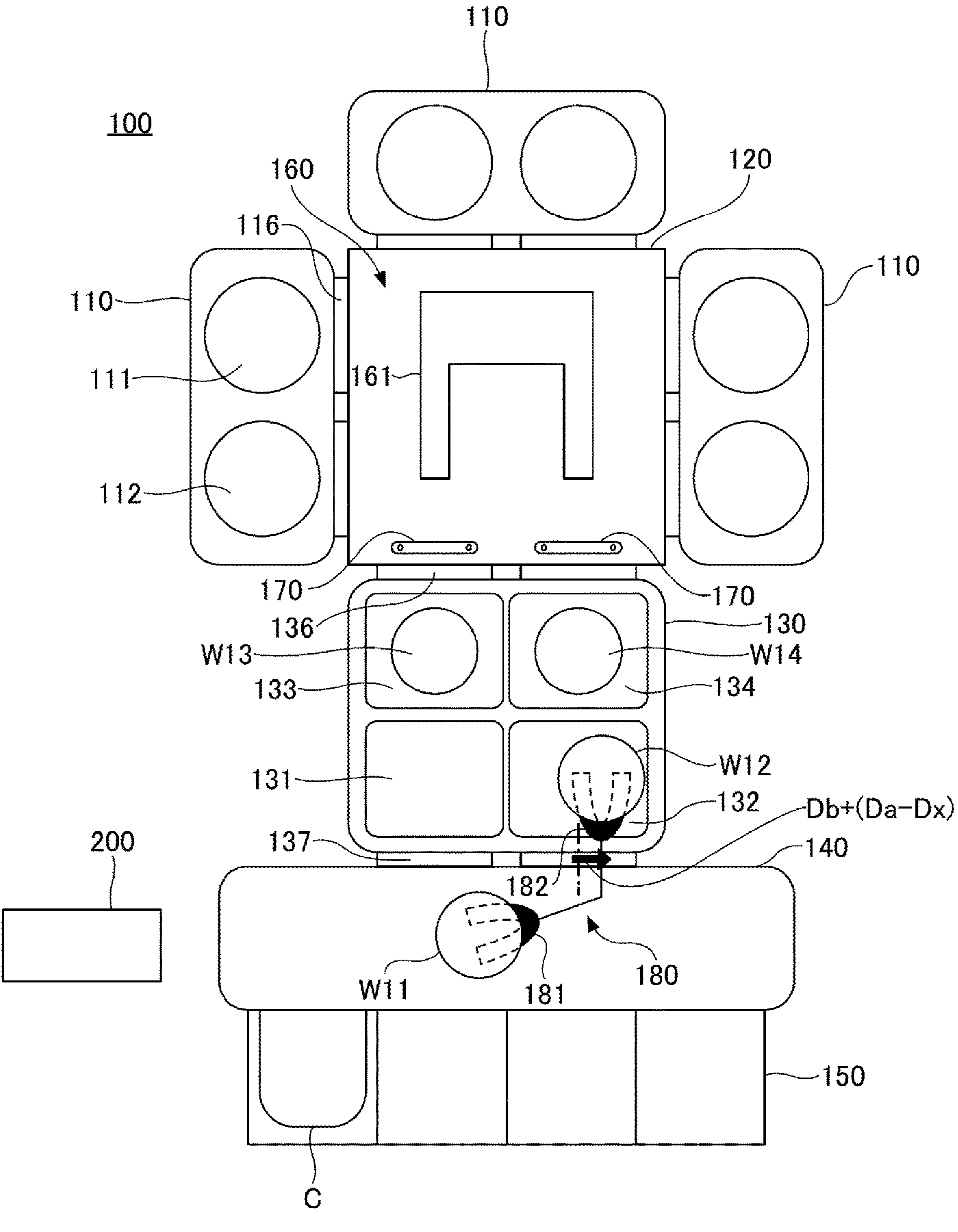
FIG. 8 is a schematic view illustrating an example of a case in which a wafer is received by a second pick of the atmospheric transfer apparatus.

FIG. 8 is a schematic diagram illustrating an example when the wafer W12 is received by the second pick 182 of the atmospheric transfer device 180. Here, the second pick 182 is moved to the receiving position corrected by the correction amount (Db+(Da−Dx)) in the direction indicated by the arrow (the right direction on the paper), and the second pick 182 receives the wafer W12 from the mounting section 132 of the load lock chamber 130.

Subsequently, the atmospheric transfer device 180 accommodates the wafer W11 held by the first pick 181 and the wafer W12 held by the second pick 182 in the carrier C. Here, the shift amounts of the wafers W11 and W12 held by the first pick 181 and the second pick 182 are less than or equal to the predetermined set amount Dx. This allows the wafers W11 and W12 to be accommodated in the carrier C.

Here, in the process illustrated in FIG. 5, the delivery position of the pick 161 of the vacuum transfer device 160 is corrected so that the shift amount between the wafer W11 held by the substrate holder 161R and the mounting section 131 is less than or equal to the set amount Dx, and the wafers W11 and W12 are delivered to the mounting sections 131 and 132. A process in which subsequently, the first pick 181 of the atmospheric transfer device 180 receives the wafer W11 from the mounting section 131 of the load lock chamber 130 at the predetermined receiving position without correction, and the second pick 182 receives the wafer W12 from the mounting section 132 of the load lock chamber 130 at the corrected receiving position has been described as an example, but the present disclosure is not limited thereto.

For example, the process may be a process in which the second pick 182 receives the wafer W11 from the mounting section 131 at the predetermined receiving position without correction, and the first pick 181 receives the wafer W12 from the mounting section 132 at the corrected receiving position.

As described above, according to the transfer method of the substrate processing system 100 of the present embodiment, even when the wafers W11 and W12 mounted on the mounting sections 111 and 112 of the processing chamber 110 are shifted, the wafers W11 and W12 may be suitably accommodated in the carrier C.

Additionally, in the transfer method of the substrate processing system 100 according to the present embodiment, as illustrated in step S105, when the pick 161 of the vacuum transfer device 160 delivers the wafers W11 and W12 to the mounting sections 131 and 132, the delivery position of the pick 161 is corrected and the wafers W11 and W12 are delivered to the mounting sections 131 and 132. Therefore, the influence on the throughput can be eliminated in comparison with a control method of adding a correcting operation in which, for example, after the delivery position of the pick 161 is corrected in accordance with the shift amount of the wafer W11, only the wafer W11 is transferred to the mounting section 131, and after the delivery position of the pick 161 is corrected again in accordance with the shift amount of the wafer W12, the wafer W12 is delivered to the mounting section 132.

Additionally, in the transfer method of the substrate processing system 100 according to the present embodiment, the wafers W11 and W12 can be accommodated in the carrier C without providing an adjustment mechanism or the like for adjusting the positional shifts of the wafers W11 and W12 to the load lock chamber 130. That is, the configuration of the substrate processing system 100 can be simplified.

Additionally, in the pick 161 that transfers the two wafers W11 and W12 at the same time, as illustrated in FIG. 5, when the wafers W11 and W12 are shifted in directions away from each other, if the delivery position of the pick 161 is corrected to cancel the shift amount Da of one wafer W11, the shift amount of the other wafer W12 becomes Db+Da. Thus, there is a possibility that the shift amount of the wafer W12 exceeds a threshold of the shift amount in which the wafer W12 can be delivered to the mounting section 132.

With respect to the above, in the transfer method of the substrate processing system 100 according to the present embodiment, the delivery position of the pick 161 is corrected so that the shift of the wafer W11 delivered to the mounting section 131 is less than or equal to the set amount Dx. That is, as illustrated in FIG. 6, the correction amount of the delivery position of the pick 161 is (Da−Dx). Additionally, the shift amount of the wafer W12 delivered to the mounting section 132 is (Db+(Da−Dx)), and thus an increase in the shift amount of the wafer W12 delivered to the mounting section 132 can be suppressed. In other words, in the transfer method of the substrate processing system 100 according to the present embodiment, the range of the transferable shift amount can be expanded.

Here, with respect to the transfer method of the substrate processing system 100 according to the present embodiment, the correction of the shift of the wafer W in the left-right direction (the width direction of the pick 161) has been described. However, the correction of the shift of the wafer W in the front-back direction (the inserting/drawing direction of the pick 161) may also be performed in substantially the same manner.

Next, an example of the correction will be further described with reference to FIGS. 9A to 11B. FIGS. 9A to 11B are side views each illustrating a positional shift state of the wafers W11 and W12 before correction and a positional shift state of the wafers W11 and W12 after correction. Here, FIGS. 9A to 11B are schematic side views of a state in which the wafer W11 held by the substrate holder 161R of the pick 161 is delivered to the lifter pin 131P of the mounting section 131, and the wafer W12 held by the substrate holder 161R of the pick 161 is delivered to the lifter pin 132P of the mounting section 132. Additionally, FIGS. 9A to 11B are views in which the load lock chamber 130 is viewed from the atmospheric transfer chamber 140 side. Additionally, the shift amount will be described assuming that the left direction of the paper (the substrate holder 161R side when viewed from the pick 161) is + and the right direction of the paper (the substrate holder 161L side when viewed from the pick 161) is −.

Figure 9A:
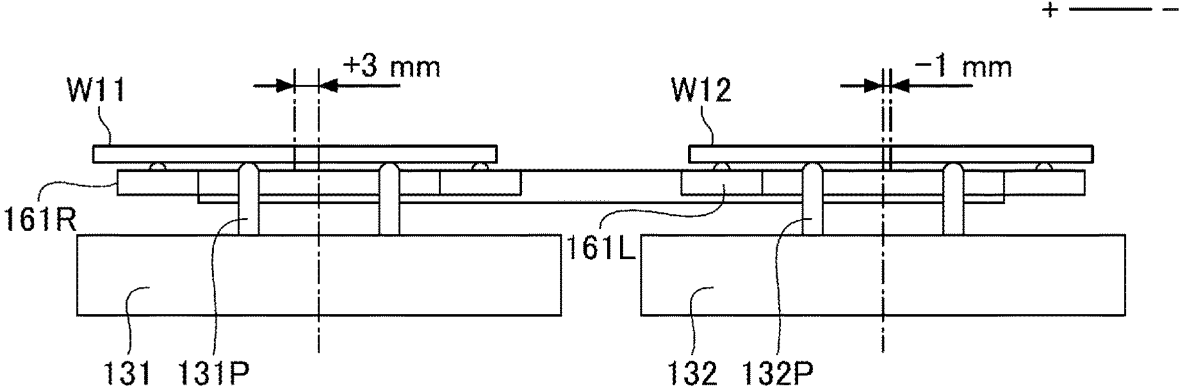
FIG. 9A is a side view illustrating a positional shift state of a wafer before correction and a positional shift state of a wafer after correction.

In FIG. 9A, the wafer W11 held by the substrate holder 161R is shifted by +3 mm, and the wafer W12 held by the substrate holder 161L is shifted by −1 mm. That is, the shifts of the wafer W11 and the wafer W12 are in directions away from each other.

Figure 9B:
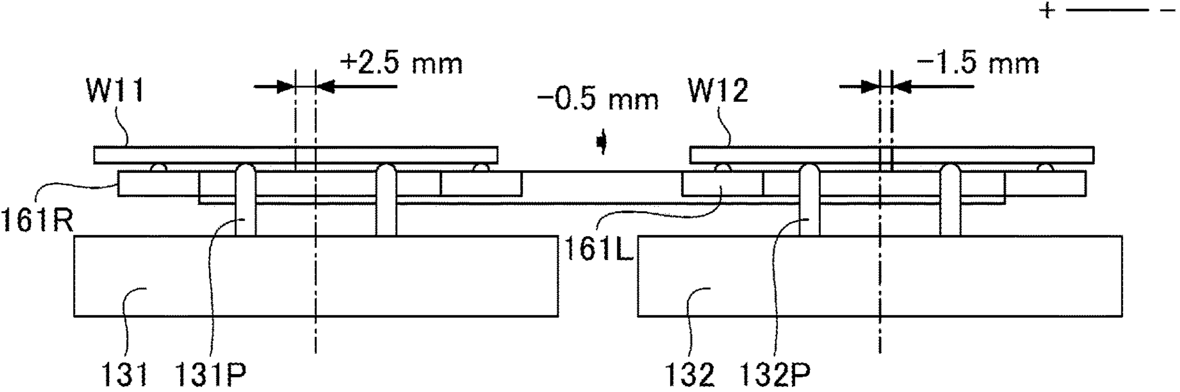
FIG. 9B is a side view illustrating a positional shift state of a wafer before correction and a positional shift state of a wafer after correction.

In this case, the correction amount of the pick 161 is set to −0.5 mm so that the shift amount of the wafer W11 delivered to the mounting section 131 falls within the set amount Dx (=2.5 mm). Thus, as illustrated in FIG. 9B, the shift amount of the wafer W11 delivered to the mounting section 131 falls within the set amount Dx. Therefore, the atmospheric transfer device 180 can move the first pick 181 to the predetermined receiving position, receive the wafer W11 from the mounting section 131 of the load lock chamber 130 (S106), and transfer the wafer W11 to the carrier C. Additionally, the atmospheric transfer device 180 can set the correction amount of the second pick 182 to −1.5 mm (S107), move the second pick 182 to the corrected receiving position, receive the wafer W12 from the mounting section 132 of the load lock chamber 130 (S108), and transfer the wafer W12 to the carrier C.

Figure 9C:
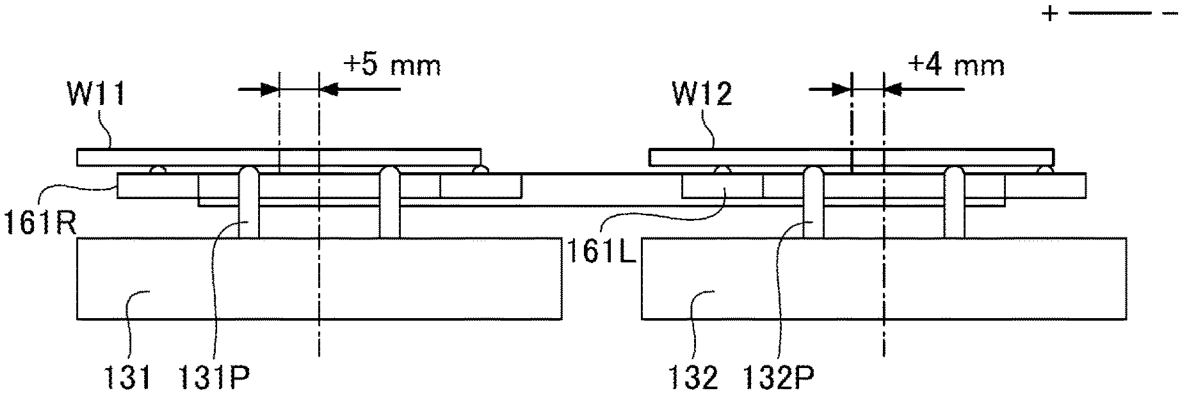
FIG. 9C is a side view illustrating a positional shift state of a wafer before correction and a positional shift state of a wafer after correction.

In FIG. 9C, the wafer W11 held by the substrate holder 161R is shifted by +5 mm, and the wafer W12 held by the substrate holder 161L is shifted by +4 mm. That is, the wafer W11 and the wafer W12 are shifted in the same direction.

Figure 9D:
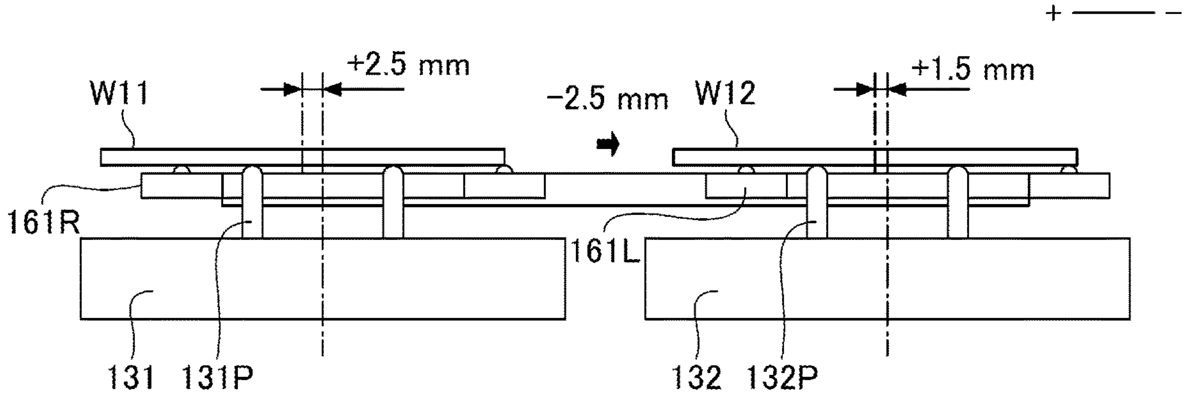
FIG. 9D is a side view illustrating a positional shift state of a wafer before correction and a positional shift state of a wafer after correction.

In this case, the correction amount of the pick 161 is set to −2.5 mm so that the shift amount of the wafer W11 delivered to the mounting section 131 falls within the set amount Dx (=2.5 mm). Thus, as illustrated in FIG. 9D, the shift amount of the wafer W11 delivered to the mounting section 131 falls within the set amount Dx. Therefore, the atmospheric transfer device 180 can move the first pick 181 to the predetermined receiving position, receive the wafer W11 from the mounting section 131 of the load lock chamber 130 (S106), and transfer the wafer W11 to the carrier C. Additionally, the atmospheric transfer device 180 can set the correction amount of the second pick 182 to +1.5 mm (S107), move the second pick 182 to the corrected receiving position, receive the wafer W12 from the mounting section 132 of the load lock chamber 130 (S108), and transfer the wafer W12 to the carrier C.

Figure 10A:
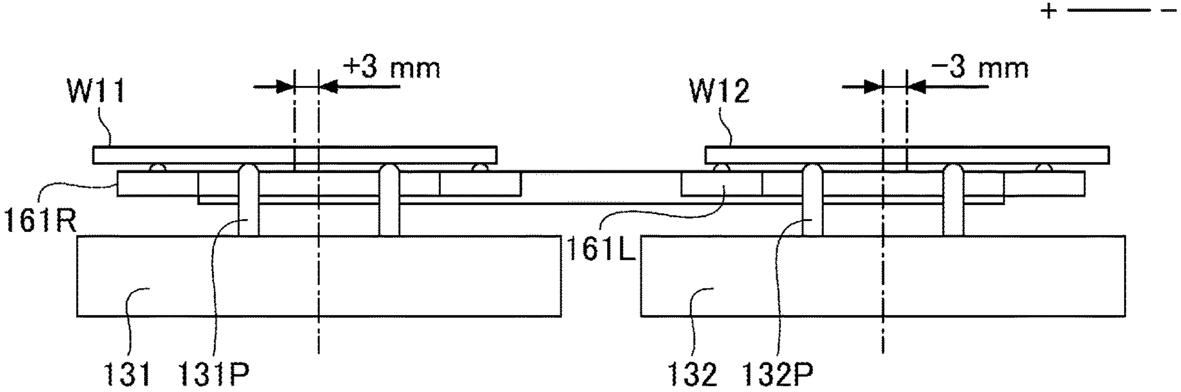
FIG. 10A is a side view illustrating a positional shift state of a wafer before correction and a positional shift state of a wafer after correction.

In FIG. 10A, the wafer W11 held by the substrate holder 161R is shifted by +3 mm, and the wafer W12 held by the substrate holder 161L is shifted by −3 mm. That is, the shifts of the wafer W11 and the wafer W12 are in directions away from each other.

Figure 10B:
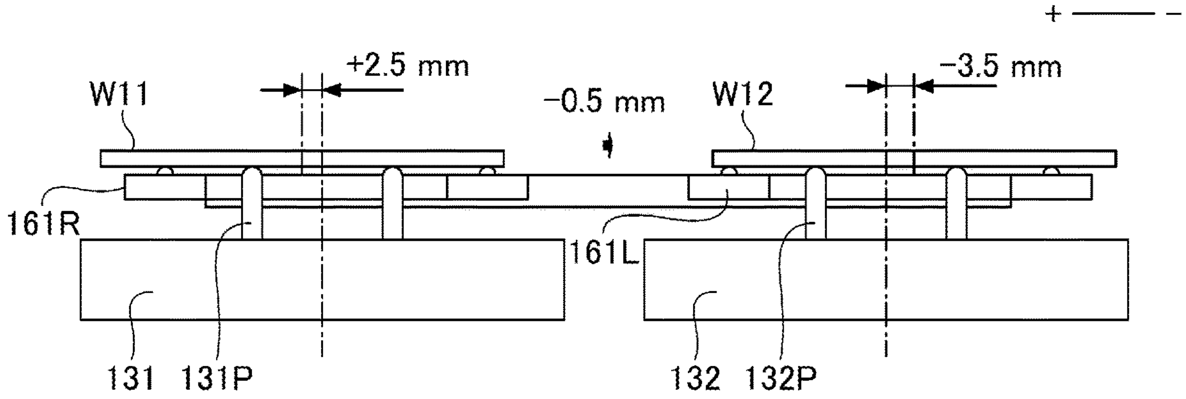
FIG. 10B is a side view illustrating a positional shift state of a wafer before correction and a positional shift state of a wafer after correction.

In this case, the correction amount of the pick 161 is set to −0.5 mm so that the shift amount of the wafer W11 to be delivered to the mounting section 131 falls within the set amount Dx (=2.5 mm). Thus, as illustrated in FIG. 10B, the shift amount of the wafer W11 delivered to the mounting section 131 falls within the set amount Dx. Therefore, the atmospheric transfer device 180 can move the first pick 181 to the predetermined receiving position, receive the wafer W11 from the mounting section 131 of the load lock chamber 130 (S106), and transfer the wafer W11 to the carrier C. Additionally, the atmospheric transfer device 180 can set the correction amount of the second pick 182 to −3.5 mm (S107), move the second pick 182 to the corrected receiving position, receive the wafer W12 from the mounting section 132 of the load lock chamber 130 (S108), and transfer the wafer W12 to the carrier C.

Figure 10C:
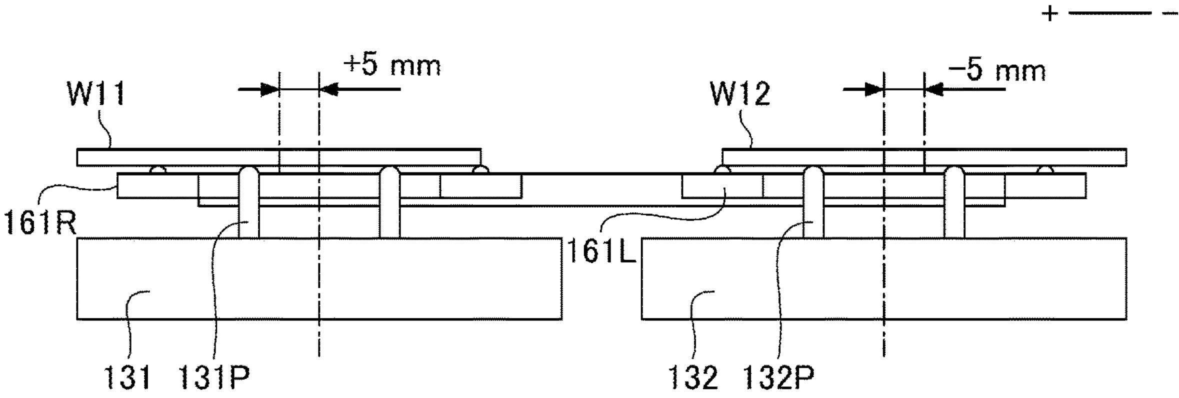
FIG. 10C is a side view illustrating a positional shift state of a wafer before correction and a positional shift state of a wafer after correction.

In FIG. 10C, the wafer W11 held by the substrate holder 161R is shifted by +5 mm, and the wafer W12 held by the substrate holder 161L is shifted by −5 mm. That is, the shifts of the wafer W11 and the wafer W12 are in directions away from each other.

Figure 10D:
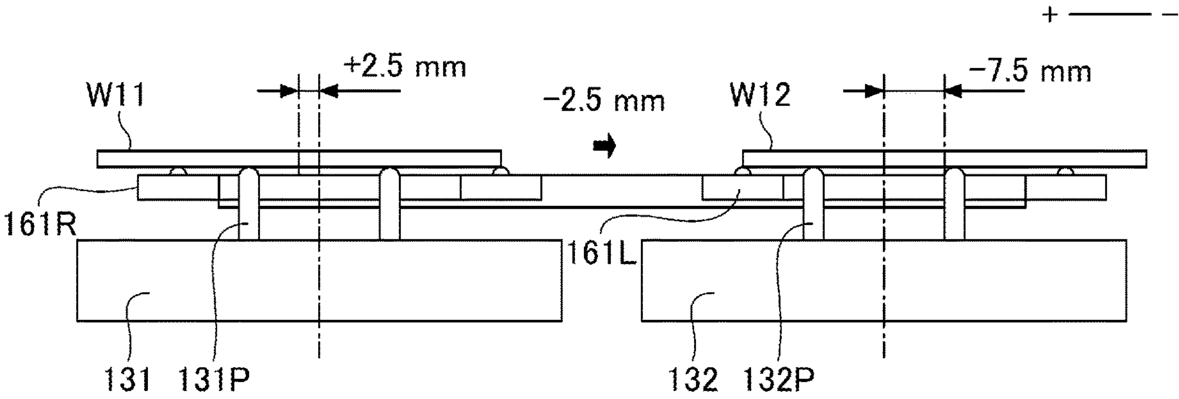
FIG. 10D is a side view illustrating a positional shift state of a wafer before correction and a positional shift state of a wafer after correction.

In this case, the correction amount of the pick 161 is set to −2.5 mm so that the shift amount of the wafer W11 delivered to the mounting section 131 falls within the set amount Dx (=2.5 mm). Thus, as illustrated in FIG. 10D, the shift amount of the wafer W11 delivered to the mounting section 131 falls within the set amount Dx. Therefore, the atmospheric transfer device 180 can move the first pick 181 to the predetermined receiving position, receive the wafer W11 from the mounting section 131 of the load lock chamber 130 (S106), and transfer the wafer W11 to the carrier C. Additionally, the atmospheric transfer device 180 can set the correction amount of the second pick 182 to −7.5 mm (S107), move the second pick 182 to the corrected receiving position, receive the wafer W12 from the mounting section 132 of the load lock chamber 130 (S108), and transfer the wafer W12 to the carrier C.

Figure 11A:
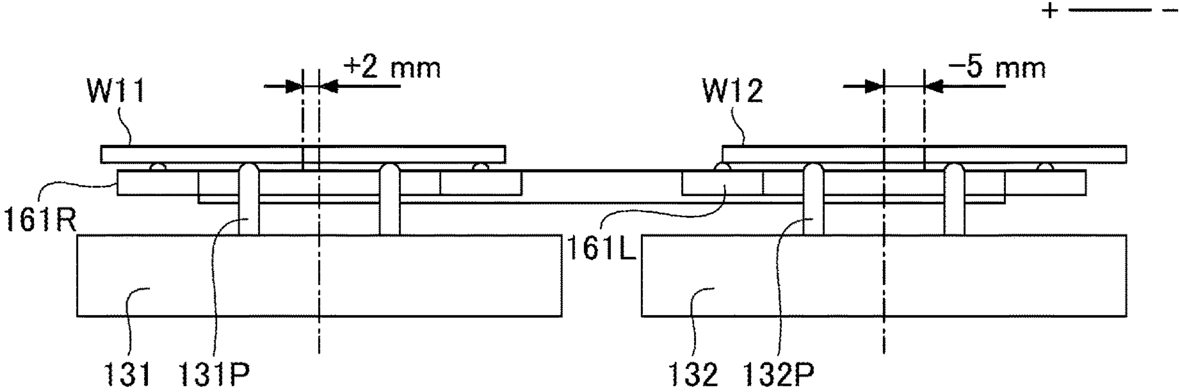
FIG. 11A is a side view illustrating a positional shift state of a wafer before correction and a positional shift state of a wafer after correction.

In FIG. 11A, the wafer W11 held by the substrate holder 161R is shifted by +2 mm, and the wafer W12 held by the substrate holder 161L is shifted by −5 mm. That is, the shifts of the wafer W11 and the wafer W12 are in directions away from each other.

Figure 11B:
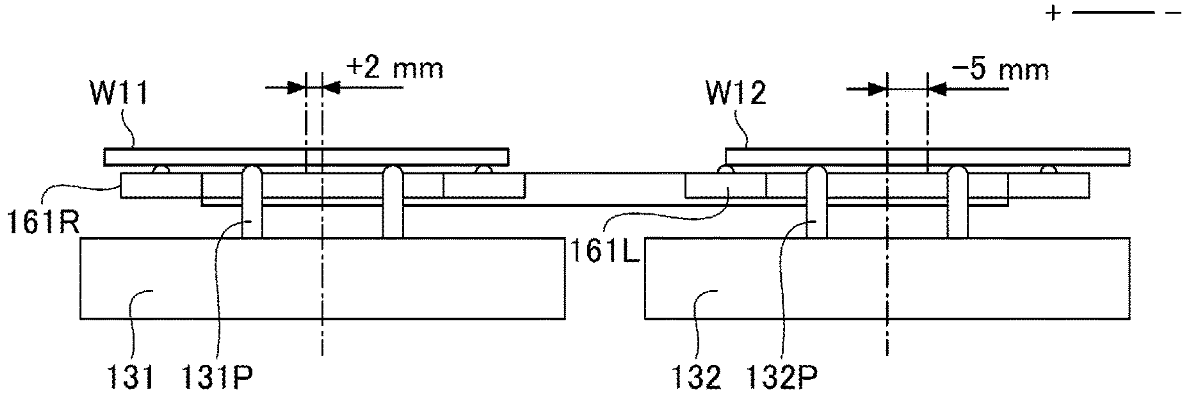
FIG. 11B is a side view illustrating a positional shift state of a wafer before correction and a positional shift state of a wafer after correction.

In this case, the shift amount of the wafer W11 to be delivered to the mounting section 131 falls within the set amount Dx (=2.5 mm), and the correction amount of the pick 161 is set to 0 mm. Thus, as illustrated in FIG. 11B, the shift amount of the wafer W11 delivered to the mounting section 131 falls within the set amount Dx. Therefore, the atmospheric transfer device 180 can move the first pick 181 to the predetermined receiving position, receive the wafer W11 from the mounting section 131 of the load lock chamber 130 (S106), and transfer the wafer W11 to the carrier C. Additionally, the atmospheric transfer device 180 may set the correction amount of the second pick 182 to −5 mm (S107), move the second pick 182 to the corrected receiving position, receive the wafer W12 from the mounting section 132 of the load lock chamber 130 (S108), and transfer the wafer W12 to the carrier C.

Although the substrate processing system 100 has been described above, the present disclosure is not limited to the above-described embodiments and the like, and various modifications and improvements can be made within the scope of the gist of the present disclosure described in the claims.

This application is based on and claims priority to Japanese Patent Application No. 2021-050068 filed on Mar. 24, 2021, the entire contents of which are incorporated herein by reference.

DESCRIPTION OF REFERENCE SYMBOLS

100 substrate processing system
110 processing chamber
111, 112 mounting section
120 vacuum transfer chamber (first transfer device)
130 load lock chamber
131 mounting section (first mounting section)
132 mounting section (second mounting section)
140 atmospheric transfer chamber
150 load port
160 vacuum transfer device
161, 162 pick
161R, 161L, 162R, 162L substrate holder
170 sensor
180 atmospheric transfer device (second transfer device)
181 first pick
182 second pick
200 controller
W wafer
W11 wafer (first substrate)
W12 wafer (second substrate)
C carrier

The invention claimed is:

1. A substrate transfer method comprising:

simultaneously receiving a first substrate and a second substrate by a pick of a first transfer device;

detecting a first shift amount of the first substrate and a second shift amount of the second substrate that are held by the pick;

calculating a correction amount of a delivery position of the pick of the first transfer device based on the first shift amount of the first substrate and correcting the delivery position of the pick of the first transfer device based on the correction amount;

moving the pick of the first transfer device to the corrected delivery position of the pick to deliver the first substrate to a first mounting section of a second chamber and deliver the second substrate to a second mounting section of the second chamber, the first substrate and the second substrate being simultaneously held by the pick of the first transfer device after the receiving of the first substrate and the second substrate;

moving a first pick of a second transfer device to a receiving position of the first mounting section to receive the first substrate by the first pick;

calculating a receiving correction amount of a receiving position of a second pick of the second transfer device based on the correction amount of the delivery position of the pick and the second shift amount of the second substrate and correcting the receiving position of the second pick based on the receiving correction amount; and moving the second pick of the second transfer device to the corrected receiving position of the second pick to receive, by the second pick, the second substrate that is delivered by the first transfer device.

2. The substrate transfer method as claimed in claim 1, wherein the calculating of the correction amount of the delivery position of the pick calculates the correction amount by which the first shift amount of the first substrate with respect to a reference position of the first mounting section falls within a predetermined threshold when the first substrate is delivered to the first mounting section of the second chamber.

3. The substrate transfer method as claimed in claim 2, wherein the calculating of the correction amount of the delivery position of the pick does not correct the delivery position of the pick in a case where the first shift amount of the first substrate is within the threshold.

4. The substrate transfer method as claimed in claim 1, wherein the first transfer device is provided in a vacuum transfer chamber and transfers the first substrate and the second substrate between the vacuum transfer chamber and a processing chamber and between the vacuum transfer chamber and a load lock chamber, and wherein the second transfer device is provided in an atmospheric transfer chamber and transfers the first substrate and the second substrate between the atmospheric transfer chamber and the load lock chamber.

5. The substrate transfer method as claimed in claim 1, wherein the moving of the second pick of the second transfer device is performed after the moving of the pick of the first transfer device.

6. The substrate transfer method as claimed in claim 1, wherein the simultaneously receiving the first substrate and the second substrate includes receiving the first substrate and the second substrate disposed in a processing chamber, and wherein the substrate transfer method further comprises accommodating the received first substrate and the received second substrate in a carrier.

7. The substrate transfer method as claimed in claim 1, wherein the moving of the second pick of the second transfer device to the corrected receiving position of the second pick including moving the second pick holding no substrate to the corrected receiving position of the second pick to hold the second substrate.

* * * * *